United States Patent
Gower et al.

(10) Patent No.: US 7,119,593 B2
(45) Date of Patent: Oct. 10, 2006

(54) DELAYED SIGNAL GENERATION CIRCUITS AND METHODS

(75) Inventors: Kevin C. Gower, LaGrangeville, NY (US); Swati Sathaye, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/053,695

(22) Filed: Feb. 8, 2005

(65) Prior Publication Data

US 2006/0176090 A1 Aug. 10, 2006

(51) Int. Cl.
*H03L 7/06* (2006.01)

(52) U.S. Cl. ...................... 327/158; 327/161

(58) Field of Classification Search ................ 327/158, 327/161, 153
See application file for complete search history.

(56) References Cited

U.S. PATENT DOCUMENTS

| | | | |
|---|---|---|---|
| 5,764,092 A | 6/1998 | Wada et al. ................ 327/271 |
| 6,421,784 B1 | 7/2002 | Chu et al. ................... 713/401 |
| 6,486,716 B1* | 11/2002 | Minami et al. ............. 327/152 |
| 6,539,072 B1* | 3/2003 | Donnelly et al. ........... 375/371 |
| 2002/0041196 A1* | 4/2002 | Demone et al. ............ 327/158 |
| 2005/0162208 A1* | 7/2005 | Zhang et al. ............... 327/276 |
| 2006/0038596 A1* | 2/2006 | Wang ......................... 327/158 |

* cited by examiner

*Primary Examiner*—Long Nguyen
*Assistant Examiner*—Ryan Jager
(74) *Attorney, Agent, or Firm*—Cantor Colburn LLP

(57) ABSTRACT

Circuitry for delaying a signal includes a phase-locked loop comprising one or more output nodes for outputting one or more output signals in response to a reference signal. A buffer is coupled to the output nodes of the phase-locked loop for receiving phase-locked loop output signals and outputs one or more buffered output signals. A multiplexing element receives the buffered output signals and a control signal and generates an operative buffered output signal in response to the control signal. A delay line receives a delay control input signal and the operative buffered output signal from the multiplexing element. The delay line outputs a delayed output signal in response to the delay control input signal.

10 Claims, 3 Drawing Sheets

DELAYED SIGNAL GENERATION CIRCUITS AND METHODS

BACKGROUND OF THE INVENTION

The present invention relates generally to signal delay devices, and in particular to digital delay elements that are programmable for use with computer system components.

As the operation speed of computer systems continues to increase, the need exists to delay either clock or data signals to optimize the critical timing within the computer system due to the timing requirements of system components. Certainly, as the clock rate in the system increases, timing between the computer elements and within the computer chips becomes critical. One method to control the timing has been with a delay elements controllable through a digital Delay Locked Loop ("DLL"). These devices have been typically limited to coarse variable-delays where the incremental delay unit is one or two logic gates providing one or two blocked delay units, accordingly. Additionally, these devices could not be used to generate multiple delayed signals without including a DLL in each clock domain and doing so would result in large circuit overhead.

A design consideration for a delay element is its delay resolution and its insertion delay. The delay resolution is the unit of delay available through a delay element. Conventional delay circuits with blocked unit delays may be acceptable for low frequency operation, but high performance circuits require fractional increments of blocked delays. Insertion delay is the amount of delay generated by a delay element when at a zero delay state. The insertion delay is an important consideration particularly when deskewing data, since any added delay in a data path decreases overall performance.

Accordingly, a need exists for a programmable delay element for high performance computer systems that has greater delay resolution and negligible insertion delay. Also since different portions of a circuit can require different amounts of delay in the clock, a signal generation and distribution circuit is needed that is designed to accommodate multiple configurable and flexible delay requirements while maintaining a high degree of accuracy and minimizing circuit overhead.

SUMMARY OF THE INVENTION

Embodiments of the invention include circuitry for delaying a signal, comprising a phase-locked loop comprising one or more output nodes for outputting one or more output signals in response to a reference signal; a buffer coupled to the output nodes of the phase-locked loop for receiving phase-locked loop output signals, and comprising one or more output nodes for outputting one or more buffered output signals; a multiplexing element for receiving the buffered output signals and a control signal, wherein the multiplexing element generates an operative buffered output signal in response to the control signal; and a delay line receiving a delay control input signal and the operative buffered output signal from the multiplexing element; wherein the delay line outputs a delayed output signal in response to the delay control input signal.

Embodiments of the invention also include circuitry for delaying a signal, comprising a phase-locked loop comprising one or more output nodes for outputting one or more output signals in response to a reference signal; a buffer coupled to the output nodes of the phase-locked loop for receiving phase-locked loop output signals, and comprising one or more output nodes for outputting one or more buffered output signals; and one or more delay assemblies further comprising: a multiplexing element for receiving the buffered output signals and a control signal, wherein the multiplexing element generates an operative buffered output signal in response to the control signal; a delay line for receiving a delay control input signal and the operative buffered output signal from the multiplexing element; wherein the delay line outputs a delayed output signal, the delayed output signal being responsive to the delay control input signal; and a buffer element coupled to the delay line for receiving the delayed output signal.

Embodiments of the invention also include a method for generating a delayed signal, comprising generating a first output signal and a second output signal in response to a reference signal by a phase-locked loop; buffering the first output signal and the second output signal; generating an operative buffered output signal in response to the first output signal and the second output signal and a control signal; and delaying the operative buffered output signal to provide a delayed output signal.

BRIEF DESCRIPTION OF THE DRAWINGS

These and other features, aspects, and advantages will become better understood when the following detailed description is read with reference to the accompanying drawings in which like characters represent like parts throughout the drawings, wherein.

DETAILED DESCRIPTION

Figure 1:
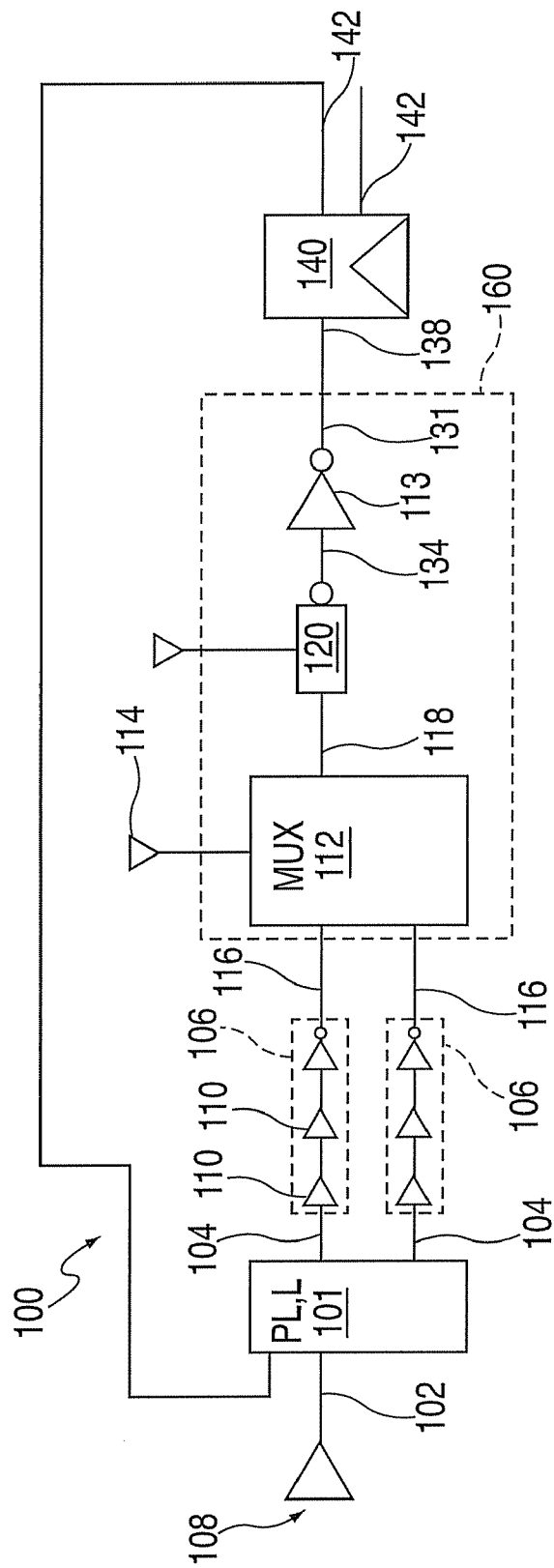
FIG. 1 is a block diagram of an exemplary embodiment of a delayed signal generation circuit as disclosed herein.

In the following description, numerous specific details are set forth to provide a thorough understanding of the subject matter disclosed herein. It should be noted, however, that those skilled in the art are capable of practicing the subject matter disclosed herein without such specific details.

Furthermore, the delayed signal generation circuits can be adaptable to a both on-chip and off-chip delay circuitry in a computer system. All such variations are intended to be included within the scope of this disclosure. It is recognized that, in the drawings, only those signal lines and processor blocks necessary for the operation are shown. In other instances, well-known circuits have been shown in block diagram form.

FIG. 1 is a block diagram of a programmable delay element 100. Programmable delay element 100 has a phase-locked loop 101, which has one or more input nodes 102 and one or more output nodes 104. Phase-locked loop 101 is coupled to reference signal 108 at an input node 102 and is coupled to buffers 106 at output nodes 104. In an exemplary embodiment, one output node 104 outputs a first signal in phase the reference signal 108 and another output node 104 outputs a second signal one quarter of cycle out of phase with the reference signal 108.

Buffers 106 comprises one or more buffer elements 110 that may be used for signal distribution purposes. Each buffer 106 is configured to receive an output signal from phase-locked loop 101 and output corresponding buffered signals. Multiplexing element 112 has one or more input nodes 116 and an output node 118. The outputs of buffers 106 are coupled to an input node 116 of multiplexing element 112. Multiplexing element 112 receives a control signal 114. Multiplexing element 112 selectively outputs an output signal based on an input signal from an input nodes 116 responsive to control signal 114 as described in further detail herein. Output node 118 is coupled to a delay line 120 which is coupled to a clock buffer 113. In an exemplary embodiment, multiplexing element 112, delay line 120, and buffer element 113 form a delay assembly 160 as shown in FIG. 1.

Multiplexing element 112 can be constructed with various combinations of logical gates. In an exemplary embodiment, a multiplexing element may include NAND gates and inverters. Further, multiplexing element 112 may contain multiple multiplexers that are configured to receive control signal 114 and the buffered output signals from buffer 106. Multiplexing element 112 outputs an operative buffered output signal through node 118 responsive to control signal 114.

Figure 2:
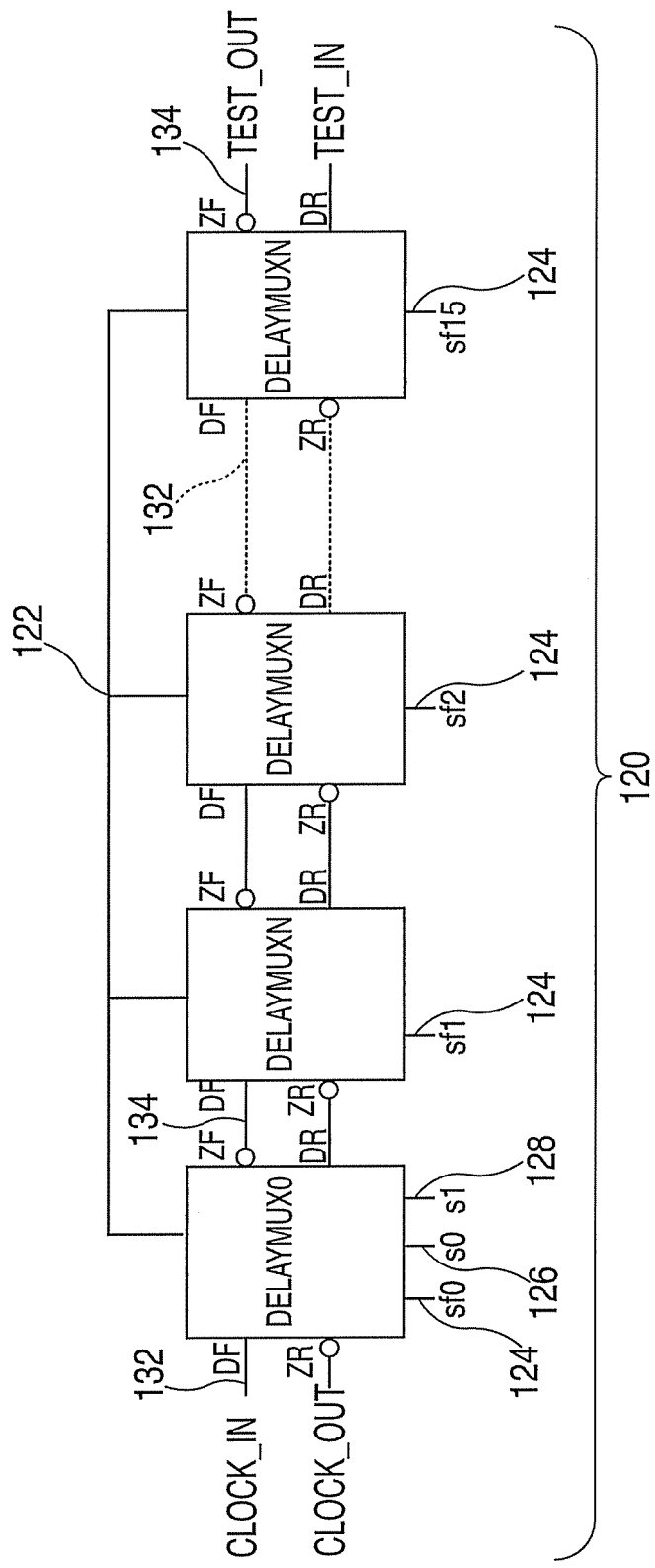
FIG. 2 is a block diagram of an exemplary embodiment of a delay line as disclosed herein.

FIG. 2 is a block diagram of an exemplary embodiment of delay line 120. Delay line 120 includes one or more cascaded programmable delay elements 122. Delay line 120 receives a delay control input signal that is coupled to delay elements 122 for selectively adding delay in the signal path responsive to the delay control input signal. Each programmable delay element 122 has a select bit input 124, which is used to select a forward path. When select bit input 124 of delay element 122 is set to '1', one unit delay gets added in the signal path. This one unit delay is the addition of the delay from signal input node 132 to signal output node 134. Delay element 122 control inputs 126 and 128 can be used to further refine the amount of delay added in the signal path. When delay element 122 control input 126 is set to '1', ¼ unit delay gets added in the signal path. When delay element 122 control input 128 is set to '1', ½ unit delay gets added in the signal path. Delay element 122 control inputs 126 and 128 can be enabled either with or without setting input 124 to '1'. Thus, delay line 120 can be used to add granular delay in the signal path over a wide range of combinations.

The output of delay line 120 is coupled to buffer element 113 at signal output node 134 of delay line 120. Buffer element 113 output node 131 is coupled to splitter 140 at input node 138. Buffer element 113 may be used for signal distribution purposes. Splitter 140 may be used to generate clock signals, which are output to latches through one or more output node 142.

In an exemplary embodiment a delayed clock signal can be generated with an added amount of delay less than a quarter cycle of the reference signal period by selecting a signal that is in phase the reference signal 108, through the use of multiplexing element 112. This signal may come from an output node 104 of phase-locked loop 101. The signal output from node 118 of multiplexing element 112 can then have additional delay added to the signal in delay line 120 resulting in a delayed clock signal output on node 142 that has a delay of less than a quarter cycle of the reference signal period.

In an exemplary embodiment a delayed clock signal can be generated with an added amount of delay between a quarter cycle and a half cycle of the reference signal period by selecting a signal that is one quarter cycle out of phase with the reference signal 108, through the use of multiplexing element 112. This signal may come from an output node 104 of phase-locked loop 101. The signal output from node 118 of multiplexing element 112 can then have additional delay added to the signal in delay line 120 resulting in a delayed clock signal output on node 142 that has a delay between a quarter cycle and a half cycle of the reference signal period.

In an exemplary embodiment a delayed clock signal can be generated with an added amount of delay between a half cycle and three quarters cycle the reference signal period by selecting a signal that is one half cycle out of phase with the reference signal 108, through the use of multiplexing element 112. This signal may come from an output node 104 of phase-locked loop 101 which is in phase with the reference signal 108 and which is then inverted by multiplexing element 112. The signal output from node 118 of multiplexing element 112 can then have additional delay added to the signal in delay line 120 resulting in a delayed clock signal on node 142 that has a delay between a half cycle and three quarters cycle of the reference signal period.

In an exemplary embodiment a delayed clock signal can be generated with an added amount of delay greater than three quarters cycle of the reference signal period by selecting a signal that is three quarters cycle out of phase with the reference signal 108, through the use of multiplexing element 112. This signal may come from an output node 104 of phase-locked loop 101 which is one quarter cycle out of phase with the reference signal 108 and which is then inverted by multiplexing element 112. The signal output from node 118 of multiplexing element 112 can then have additional delay added to the signal in delay line 120 resulting in a delayed clock signal output on node 142 that has a delay greater than, or equal to, three quarters cycle of the reference signal period.

Figure 3:
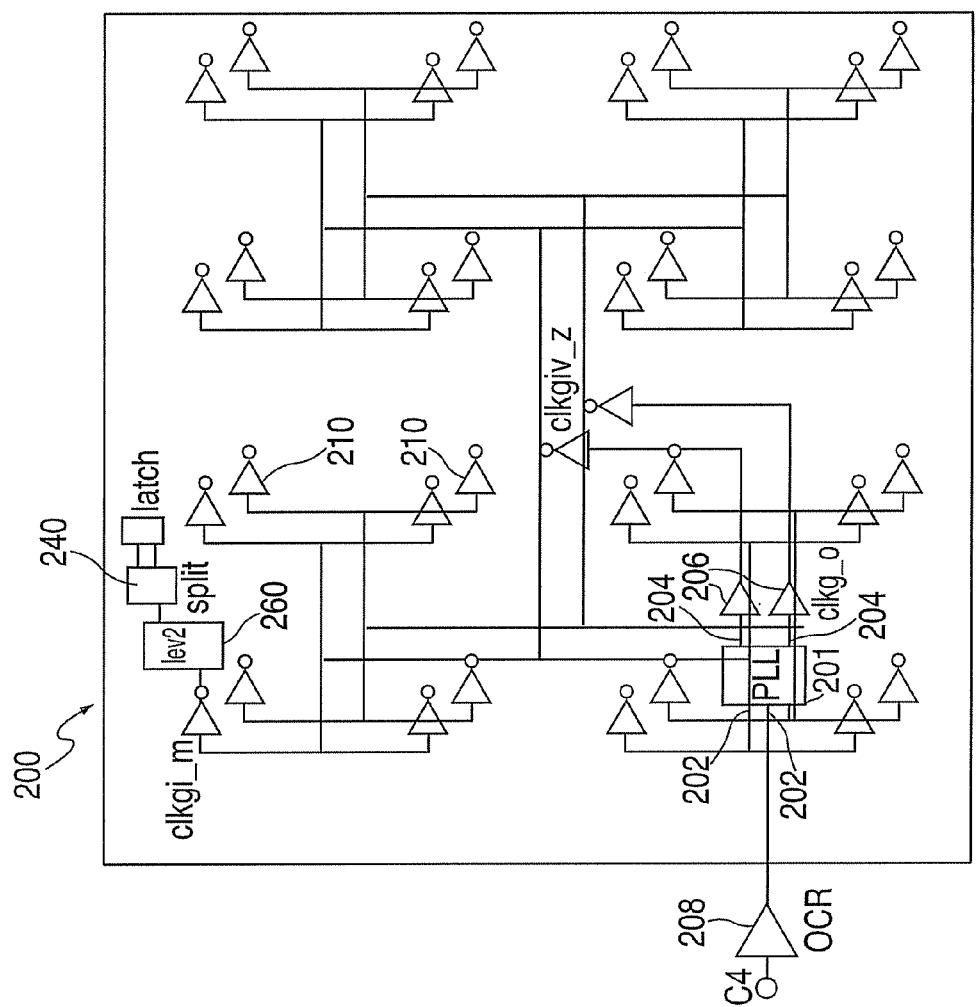
FIG. 3 is a block diagram of an exemplary embodiment of a delayed signal generation and distribution circuit as disclosed herein.

FIG. 3 is a block diagram of an exemplary embodiment of a delayed signal generation and distribution circuit 200 that has been configured to provide multiple delayed signals. Signal generation and distribution circuit 200 has a phase-locked loop 201, which has one or more input nodes 202 and one or more output nodes 204. Phase-locked loop 201 is coupled to reference signal 208 at an input node 202 and is coupled to a buffer 206 at an output node 204. In an exemplary embodiment, one output node 204 outputs a signal in phase with the reference signal 208 and another output node 204 outputs a signal one quarter of cycle out of phase with the reference signal 208. Signal generation and distribution circuit 200 may contain one or more buffer elements 210 that may be inverting, and one or more delay assemblies 260. Each delay assembly 260 may contain multiplexing element 112, delay line 120, and buffer element 113 as shown in FIG. 1. Signal generation and distribution circuit 200 may contain one or more splitters 240 that may be used to generate clock signals.

Through the use of multiple outputs from the phase-locked loop element in conjunction with the delay assemblies it is possible to generate several signals with varying amounts of delay. While delaying clock signals, it is important to keep the clock skew minimized. The usage of more delay elements can penalize clock skew by introducing larger circuit delay differences that result from ACLV (Across Chip Linewidth Variation). The design of a delayed signal generation and distribution circuit as shown in FIG. 1 and FIG. 3 allows delayed signals to be generated while using a fewer number of delay elements than existing designs. As a result, this design achieves a low clock skew while providing a highly granular delay.

As described above, the present invention can be embodied in the form of computer-implemented processes and apparatuses for practicing those processes. The present invention can also be embodied in the form of computer program code containing instructions embodied in tangible media, such as floppy diskettes, CD-ROMs, hard drives, or any other computer-readable medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed for carrying out this invention, but that the invention will include all embodiments falling within the scope of the claims.

What is claimed is:

1. Circuitry for delaying a signal, comprising:
   a phase-locked loop comprising a plurality of separate output nodes for outputting a plurality of separate phase-locked loop output signals in response to a reference signal;
   a plurality of separate buffers coupled to the separate output nodes of the phase-locked loop for receiving separate phase-locked loop output signals, and comprising a plurality of separate output nodes for outputting separate buffered output signals on separate paths;
   a multiplexing element for receiving the separate buffered output signals on the separate path and a control signal, wherein the multiplexing element selects one of the separate buffered output signals on the separate paths as an operative buffered output signal in response to the control signal; and
   a delay line receiving a delay control input signal and the operative buffered output signal from the multiplexing element; wherein the delay line outputs a delayed output signal in response to the delay control input signal, wherein the delay line includes a plurality of delay elements, wherein the delay control input signal selects a combination of delay elements to define a delay independent from delay in the phase-locked loop.

2. The circuitry for delaying a signal of claim 1, wherein the plurality of separate phase-locked loop outputs signals includes a first output signal in phase with the reference signal and a second output signal out of phase with the reference signal on separate paths.

3. The circuitry for delaying a signal of claim 2, wherein the second output signal is out of phase with the first output signal by one quarter cycle.

4. The circuitry for delaying a signal of claim 1, wherein said delay line comprises a programmable delay elements.

5. The circuitry for delaying a signal of claim 1 further comprising a splitter for receiving the delayed output signal wherein, the splitter generates clock signals from the delayed output signal.

6. Circuitry for delaying a signal, comprising:
   a phase-locked loop comprising a plurality of separate more output nodes for outputting a plurality of separate phase-locked loop output signals in response to a reference signal;
   a plurality of separate buffers coupled to the output nodes of the phase-locked loop for receiving separate phase-locked loop output signals, and comprising a plurality of separate output nodes for outputting separate buffered output signals on separate paths; and
   a delay assembly further comprising:
   a multiplexing element for receiving the separate buffered output signals on the separate paths and a control signal, wherein the multiplexing element selects one of the separate buffered output signals on the separate paths as an operative buffered output signal in response to the control signal;
   a delay line for receiving a delay control input signal and the operative buffered output signal from the multiplexing element; wherein the delay line outputs a delayed output signal in response to the delay control input signal, wherein the delay line includes a plurality of delay elements, wherein the delay control input signal selects a combination of delay elements to define a delay independent from delay in the phase-locked loop; and
   a buffer element coupled to the delay line for receiving the delayed output signal.

7. The circuitry for delaying a signal of claim 6, wherein the plurality of separate phase-locked loop outputs signals includes a first output signal in phase with the reference signal and a second output signal out of phase with the reference signal.

8. The circuitry for delaying a signal of claim 7 wherein the second output signal is out of phase with the first output signal by one quarter cycle.

9. The circuitry for delaying a signal of claim 6, wherein said delay line comprises a programmable delay elements.

10. The circuitry for delaying a signal of claim 6 further comprising a splitter for receiving the delayed output signal wherein, the splitter generates clock signals from the delayed output signal received.

* * * * *